(12) United States Patent
Lai et al.

(10) Patent No.: US 11,682,346 B2
(45) Date of Patent: Jun. 20, 2023

(54) METHOD, APPARATUS, AND DEVICE FOR DETERMINING AGING DEGREE OF PIXEL IN DISPLAY PANEL, AND METHOD, APPARATUS, AND DEVICE FOR COMPENSATING DISPLAY BRIGHTNESS OF PIXEL

(71) Applicant: BOE Technology Group Co., Ltd., Beijing (CN)

(72) Inventors: Chengte Lai, Beijing (CN); Suncun Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 389 days.

(21) Appl. No.: 16/960,433

(22) PCT Filed: Dec. 4, 2019

(86) PCT No.: PCT/CN2019/122993
§ 371 (c)(1),
(2) Date: Jul. 7, 2020

(87) PCT Pub. No.: WO2020/125417
PCT Pub. Date: Jun. 25, 2020

(65) Prior Publication Data
US 2020/0349884 A1    Nov. 5, 2020

(30) Foreign Application Priority Data

Dec. 20, 2018 (CN) .......................... 20181157783.X

(51) Int. Cl.
G09G 3/3208 (2016.01)

(52) U.S. Cl.
CPC ... G09G 3/3208 (2013.01); *G09G 2320/0233* (2013.01); *G09G 2320/043* (2013.01)

(58) Field of Classification Search
CPC .......... G09G 3/3208; G09G 2320/0233; G09G 2320/043
See application file for complete search history.

(56) References Cited

U.S. PATENT DOCUMENTS

2006/0027822 A1* 2/2006 Choi .................... G09G 3/3233
257/94
2011/0227964 A1* 9/2011 Chaji .................... G09G 3/006
345/82

(Continued)

FOREIGN PATENT DOCUMENTS

CN 102201211 A 9/2011
CN 103364703 A 10/2013
(Continued)

*Primary Examiner* — Stacy Khoo
(74) *Attorney, Agent, or Firm* — Banner & Witcoff, Ltd.

(57) ABSTRACT

A method, apparatus, and device for determining aging degrees of pixels in a display panel, and a method, apparatus, and device for compensating display luminance of pixels. The method for determining the aging degrees of the pixels in the display panel includes: for each pixel of at least a part of pixels in the display panel that includes multiple pixels, determining electric current data and temperature data of the pixel; and based on the determined current data and temperature data, calculating aging degree data of the pixel according to an attenuation model.

14 Claims, 5 Drawing Sheets

(56) References Cited

U.S. PATENT DOCUMENTS

| | | |
|---|---|---|
| 2011/0234566 A1 | 9/2011 | Asano et al. |
| 2014/0329339 A1* | 11/2014 | Chaji .................... G09G 3/006 438/10 |
| 2015/0161942 A1 | 6/2015 | Chaji et al. |
| 2017/0039946 A1 | 2/2017 | Xie |
| 2020/0027393 A1* | 1/2020 | Tang .................... G09G 3/3225 |

FOREIGN PATENT DOCUMENTS

| | | |
|---|---|---|
| CN | 105632449 A | 6/2016 |
| CN | 105788516 A | 7/2016 |
| CN | 105934789 A | 9/2016 |
| CN | 107785406 A | 3/2018 |
| WO | 2008116011 A1 | 9/2008 |

* cited by examiner

METHOD, APPARATUS, AND DEVICE FOR DETERMINING AGING DEGREE OF PIXEL IN DISPLAY PANEL, AND METHOD, APPARATUS, AND DEVICE FOR COMPENSATING DISPLAY BRIGHTNESS OF PIXEL

This application is a U.S. National Phase Entry of International Application No. PCT/CN2019/122993 filed on Dec. 4, 2019, designating the United States of America and claiming priority to Chinese Patent Application No. 201811577831.X filed on Dec. 20, 2018. The present application claims priority to and the benefit of the above-identified applications and the above-identified applications are incorporated by reference herein in their entirety.

TECHNICAL FIELD

The disclosure relates to the field of display technology, in particular to a method, an apparatus and a device for determining aging degrees of pixels in a display panel and a method, an apparatus and a device for compensating display luminance of pixels.

BACKGROUND

At present, consumers have higher and higher requirements for the size of displays and the resolution of display panels, thus requirements for the production process of the display panels are also higher and higher. Aging degree of each pixel in a display panel is not the same due to the influence of materials, technologies and other factors in the process of manufacturing the displays, and the influence of different pixel data displayed by each pixel on the display panel and other factors in the process of usage. When pixel data of the same gray-scale is displayed, the light-emitting luminance of the pixel subjected to aging is lower than that of the normal pixel. Therefore, after displaying for a certain period, pixels with different aging degrees will appear on the display panel. When using these pixels to display pixel data with the same gray-scale, the light-emitting luminance is different among these pixels, that is, image sticking appears in display, which reduces the display effect of the display panel and also reduces the usage experience of consumers.

SUMMARY

According to an aspect of present disclosure, there is provided a method for determining aging degrees of pixels in a display panel, comprising: for at least a portion of pixels in the display panel including a plurality of pixels, determining electric current data and temperature data of the pixel; determining aging degree data of the pixel according to an attenuation model, based on the determined electric current data and temperature data.

According to an embodiment of the present disclosure, determining the electric current data of the pixel comprises: determining the electric current data of the pixel based on display data of the pixel.

According to an embodiment of the present disclosure, the method further comprises: determining position data of the pixel on the display panel; wherein calculating the aging degree data of the pixel according to the attenuation model further comprises: calculating the aging degree data of the pixel according to the attenuation model, based on the determined electric current data, temperature data and position data on the display panel.

According to an embodiment of the present disclosure, determining the position data of the pixel on the display panel comprises: determining a pixel region where the pixel is located on the display panel, wherein the display panel is divided into a plurality of pixel regions; determining a position coefficient of the pixel region where the pixel is located; determining the position data of the pixel on the display panel based on the position coefficient and the position of the pixel within the pixel region.

According to another aspect of the present disclosure, there is provided a method of compensating display luminance of pixels, comprising: determining a compensation reference pixel on a display panel; for each pixel of remaining pixels except the compensation reference pixel, determining a display adjustment parameter of the pixel based on aging degree data of the pixel and aging degree data of the compensation reference pixel; and compensating display luminance of the pixel based on the display adjustment parameter.

According to an embodiment of the present disclosure, determining the compensation reference pixel comprises: determining the compensation reference pixel based on aging degree data of each pixel in the display panel.

According to an embodiment of the present disclosure, the method further comprises: determining the compensation reference pixel by statistically sorting aging degree data of each pixel in the display panel.

According to an embodiment of the present disclosure, the method further comprises: determining a gray-scale compensation parameter of the pixel based on a gamma value of the display panel and the display adjustment parameter of the pixel.

According to an embodiment of the present disclosure, the method further comprises: determining gray-scale compensation data based on gray-scale data of the pixel and the gray-scale compensation parameter.

According to an embodiment of the present disclosure, the method further comprises: outputting the gray-scale compensation data of the pixel.

According to yet another aspect of the present disclosure, there is provided an apparatus for determining aging degrees of pixels on a display panel, the display panel including a plurality of pixels, the apparatus including: a determination circuit configured to, for at least a portion of pixels of the plurality of pixels, determine electric current data and temperature data of the pixel; and an aging degree data calculation circuit configured to calculate aging degree data of the pixel according to an attenuation model, based on the determined electric current data and temperature data.

According to an embodiment of the present disclosure, the determination circuit determines the electric current data of the pixel based on display data of the pixel.

According to an embodiment of the present disclosure, the aging degree data calculation circuit is further configured to calculate the aging degree data of the pixel according to the attenuation model based on the determined electric current data, temperature data, and position data on the display panel, wherein the determination circuit determining the position data of the pixel on the display panel comprises: determining a pixel region where the pixel is located on the display panel, wherein the display panel is divided into a plurality of pixel regions; determining a position coefficient of the pixel region where the pixel is located; and determining the position data of the pixel on the display panel based on the position coefficient and the position of the pixel within the pixel region.

According to yet another aspect of the present disclosure, there is provided an apparatus for compensating display luminance of pixels, comprising: a determination circuit configured to determine a compensation reference pixel, and determine, for each pixel of the remaining pixels except the compensation reference pixel, a display adjustment parameter for the pixel based on aging degree data of the pixel and aging degree data of the compensation reference pixel; and a compensation circuit configured to compensate the display luminance of the pixel based on the display adjustment parameter.

According to an embodiment of the present disclosure, the determination circuit determines the compensation reference pixel based on aging degree data of each pixel in the display panel.

According to the embodiment of the present disclosure, the determination circuit determines the compensation reference pixel by statistically sorting the aging degree data of each pixel in the display panel.

According to an embodiment of the present disclosure, the determination circuit is further configured to determine a gray-scale compensation parameter of the pixel based on a gamma value of the display panel and the display adjustment parameter of the pixel, and the compensation circuit is further configured to determine gray-scale compensation data based on gray-scale data of the pixel and the gray-scale compensation parameter, and output the gray-scale compensation data of the pixel.

According to yet another aspect of the present disclosure, there is provided an device for determining aging degrees of pixels in a display panel, comprising a processor, and a memory comprising a set of processor executable instructions that, when executed by the processor, cause the device to perform the method for determining aging degree of pixels in the display panel as described above.

According to yet another aspect of the present disclosure, there is provided an device for compensating display luminance of pixels, comprising a processor, and a memory comprising a set of processor executable instructions that, when executed by the processor, cause the device to perform the method for compensating display luminance of pixels as described above.

BRIEF DESCRIPTION OF THE DRAWINGS

In order to more clearly explain the embodiments of the present disclosure or the technical solution in the prior art, the following will briefly introduce the drawings needed in the description of the embodiment or the prior art. Obviously, the drawings in the following description are only some embodiments of the present disclosure. For those of ordinary skill in the art, other drawings can be obtained according to these drawings without inventive labor.

DETAILED DESCRIPTION

The technical solution in the embodiments of the present disclosure will be described clearly and completely below with reference to the drawings in the embodiments of the present disclosure. Obviously, the described embodiments are only some embodiments of the present disclosure, not all embodiments. Based on the embodiments in the present disclosure, all other embodiments obtained by those of ordinary skill in the art without inventive labor are within the protection scope of the present disclosure.

The words "first", "second" and the like used in this disclosure do not indicate any order, quantity or importance, but are only used to distinguish different components. Similarly, words such as "including" or "comprising" and the like mean that the elements or articles appearing before the words cover the elements or articles listed after the words and their equivalents, and do not exclude other elements or articles. Words such as "connected" or "connected" and the like are not limited to physical or mechanical connections, but may include electrical connections, whether direct or indirect.

Flowcharts are used in the present disclosure to illustrate steps of methods According to an embodiment of the present disclosure. It should be understood that preceding or following steps are not necessarily precisely carried out in an order. Instead, various steps may be processed in a reverse order or simultaneously. At the same time, other operations can be added to these processes, or one or more steps can be removed from these processes.

Figure 1:
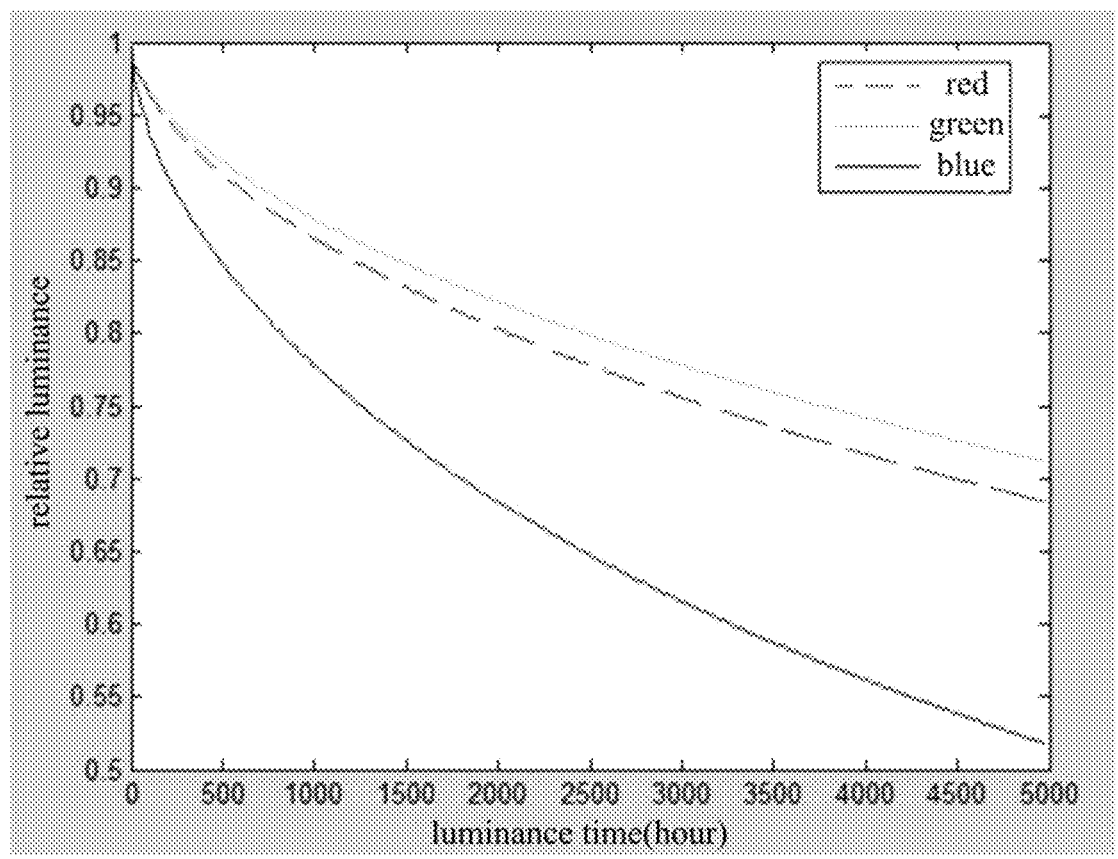
FIG. 1 shows a schematic diagram of a change of light-emitting luminance of a pixel with light-emitting time.

Display panels such as Organic Light Emitting Display (OLED) are increasingly applied in various application fields. In a process of using a display panel, due to the influence of pixel aging, the light-emitting luminance (also referred to as display luminance) of pixels will decrease with the increase of display time. FIG. 1 shows a schematic diagram of a change of light-emitting luminance of a pixel in a display panel with light-emitting time, wherein the abscissa represents the light-emitting time, the ordinate represents the normalized relative luminance, and wherein the light-emitting luminance of pixel not influenced by the pixel aging is set to 1. As can be seen from FIG. 1, the light-emitting luminance of the pixel of three primary colors of red, green and blue respectively decreases with the increase of the light-emitting time. In addition, because an aging degree of each pixel in the display panel is not the same, degrees of reduction in the light-emitting luminance between different pixels are also different, resulting in a phenomenon of image sticking in display, which will reduce the display effect of the display panel, shorten the service life of the display panel and influence the user experience.

There is a method for detecting a threshold voltage of a driving thin film transistor (also referred to as a driving transistor) in an OLED driving circuit corresponding to respective pixel on an OLED by detecting an electric current flowing through the driving thin film transistor, and the threshold voltage may indicate an aging degree of respective pixel. However, in the above method for determining the aging degree of the pixel by detecting the electric current flowing through the drive thin film transistor, an additional measurement circuit is required to periodically detect the electric current of the driving transistor, and the accuracy of the measured electric current is not high. In addition, the influence of other factors (such as temperature, pixel position in the display panel, etc.) on pixel aging is not considered in the above-mentioned method.

The present disclosure provides a method, an apparatus and a device for determining aging degrees of pixels in a display panel and a method, an apparatus and a device for compensating display luminance of pixels. An attenuation model characterizing the aging degree of a pixel is constructed based on various factors that influence the aging degree of the pixel, such as temperature data, electric current data, pixel position data in the display panel, etc. In the method for determining the aging degrees of the pixels in the display panel according to the present disclosure, electric current data and temperature data along with position data on the display panel determined for each pixel in the display panel are utilized to calculate and obtain aging degree data of the pixel which changes over time according to the constructed attenuation model. In addition, in the present disclosure, the aging degree data of each pixel can also be updated regularly by setting a sampling time interval, and the aging degree data can be stored in a memory for compensating display data of the pixel in real time. In the method for compensating the display luminance of pixels according to the present disclosure, firstly, a compensation reference pixel is determined based on the aging degree data of each pixel in the display panel, and display data of a pixel to be compensated at present is compensated based on aging degree data of the compensation reference pixel and the aging degree data of the pixel to be compensated at present, so that the light-emitting luminance of respective pixels which are needed to display the same gray-scale are consistent, the problem of image sticking in display is avoided, the service life of the display panel is prolonged, and the user experience is improved.

Figure 2:
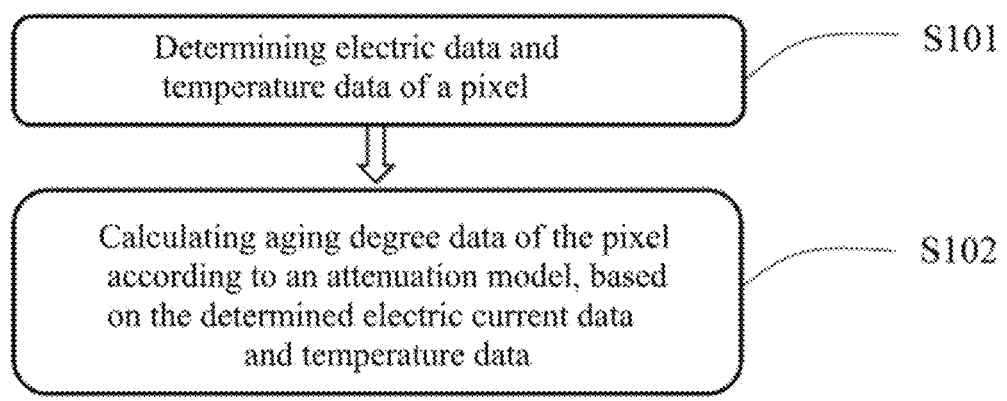
FIG. 2 shows a flowchart of a method for determining aging degrees of pixels in a display panel according to an embodiment of the present disclosure.

FIG. 2 shows a flowchart of a method for determining aging degrees of pixels in a display panel according to an embodiment of the present disclosure, for determining aging degree data for at least a portion of pixels in the display panel including a plurality of pixels. According to some embodiments of the present disclosure, the aging degree data may be determined for a portion of pixels in the display panel according to actual application requirements, or the aging degree data may be determined for each pixel in the display panel. In this specification, the aging degree data being determined for each pixel in the display panel is illustrated as an example.

As shown in FIG. 2, first, in step S101, electric current data and temperature data of a pixel are determined, the pixel can be any pixel in the display panel whose aging degree needs to be determined, and the pixel can be represented as a pixel to be compensated herein. According to an embodiment of the present disclosure, the electric current data of the pixel to be compensated can be calculated using display data of the pixel to be compensated, for example, the display data can be display gray-scale data, and the temperature data of the pixel to be compensated can be measured and calculated using a temperature sensor or the like.

Next, in step S102, based on the determined electric current data and temperature data, the aging degree data of the pixel is calculated according to an attenuation model. The attenuation model may be a function that characterizes the aging degree of the pixel, for example, according to some embodiments of the present disclosure, the attenuation model may be a function regarding the influences of temperature and electric current on pixel aging.

According to an embodiment of the present disclosure, functions of the influences of temperature and electric current on the pixel aging can be determined separately. For example, $T_{gain}$ is a function that characterizes the influence of temperature on the aging degree of the pixel and $L_{gain}$ is a function that characterizes the influence of electric current on the aging degree of the pixel.

The attenuation model F can then be expressed as:

$$F = a * T_{gain} * L_{gain} \qquad (1)$$

where a is a constant.

According to an embodiment of the present disclosure, for example, a function of the influence of temperature on the aging degree of the pixel may be determined according to the following function, which is referred to as a temperature attenuation function $T_{gain}$:

$$T_{gain} = \exp\left[\frac{E}{k}\left(\frac{1}{T_R} - \frac{1}{T_N}\right)\right] \qquad (2)$$

where, E is activation energy, k is a Boltzmann constant, $T_R$ is room temperature (for example, it can be set to 25° C.), and $T_N$ is an operating temperature, i.e., the temperature data at present determined for the pixel to be compensated. According to an embodiment of the present disclosure, the temperature attenuation function $T_{gain}$ can be constructed by a large amount of measured data, thus, after determining operating temperature data $T_N$ of a certain pixel to be compensated, aging degree data of the pixel to be compensated at present influenced by the temperature can be calculated according to the temperature attenuation function $T_{gain}$.

According to an embodiment of the present disclosure, the operating temperature $T_N$ may be determined by, for example, the following function:

$$T_N = T_0 + A + B * C_{avg} \qquad (3)$$

where, $T_0$ is ambient temperature, which can be measured, for example, by a temperature sensor provided on the display panel, A is a temperature offset, B is a specific constant, and $C_{avg}$ is an average electric current value, for example, the average electric current value can be determined by display gray-scale data of the pixel to be compensated.

According to an embodiment of the present disclosure, electric current data of the pixel to be compensated at present may be determined based on display data of the pixel to be compensated, wherein the display data may be the display gray-scale data of the pixel to be compensated, for example, the display gray-scale data corresponds to data with a numerical value range of 0-255.

The electric current value flowing through a pixel in the display panel may be an important factor influencing the aging degree of the pixel. In practical application, it is difficult to accurately and directly measure the electric current value flowing through the pixel. The electric current value has a linear relationship with light-emitting luminance of the pixel, and the light-emitting luminance of the pixel also has a correlation with the display gray-scale data of the pixel. Thus, in the embodiments according to the present disclosure, the electric current data influencing the aging degree of the pixel can be calculated using the relationship among the electric current value, the light-emitting luminance and the display gray-scale data.

Specifically, in the process of displaying using the display panel, the linear relationship between electric current data Current of a pixel (a pixel to be compensated) and light-emitting luminance of the pixel can be expressed as the following formula (4):

$$\text{Current} = k1 * \text{Lum} \tag{4}$$

where, k1 is a linear coefficient and Lum is luminance data of the pixel to be compensated.

The luminance data has a correlation with display gray-scale data of the pixel, for example, the correlation may be expressed as:

$$\text{Lum} = \text{Gray}^{gamma} \tag{5}$$

where, Lum represents the luminance data, Gray represents the normalized display gray-scale data of the pixel, and gamma represents a gamma value of the display panel. For example, in a case where the display gray-scale data corresponds to a numeral value range of 0-255 for gray-scale, and actual display gray-scale data of the pixel is 100, the normalized display gray-scale data is $$\text{Gray} = \frac{100}{255}.$$

Thus, through the above two equations (4)-(5), the normalized display gray-scale data Gray of the pixel can be converted into the luminance data Lum of the pixel, and the luminance data Lum of the pixel can be converted into the electric current data Current of the pixel according to the linear relationship between the luminance data Lunn of the pixel and the electric current data Current of the pixel.

According to an embodiment of the present disclosure, an attenuation model of the influence of electric current data of the pixel on the aging degree of the pixel, i.e., a electric current attenuation function $L_{gain}$, can be constructed by aid of a large amount of measured data. The electric current attenuation function $L_{gain}$ may be an empirical numeral value determined by experimental data. For example, aging degree data of the pixel changing over time and corresponding to different electric current data can be obtained through experimental measurement. Therefore, after the electric current data of a certain pixel is determined, the aging degree data of the pixel at present influenced by the electric current can be obtained according to the electric current attenuation function $L_{gain}$.

According to an embodiment of the present disclosure, firstly, the attenuation model F of the pixel is determined, and the attenuation model F can be obtained through a large number of tests in advance. According to an embodiment of the present disclosure, during the operation of the display panel, temperature data and electric current data of each pixel at present are determined, and aging degree data of each pixel at present is determined according to the attenuation model. Therefore, the method for determining the aging degrees of the pixels in the display panel according to the present disclosure calculates the aging degree data of the pixel to be compensated at present according to the model established based on the measured data along with the temperature data and electric current data of the pixel to be compensated obtained in real time.

According to an embodiment of the present disclosure, the method for determining the aging degree of the pixels in the display panel may further comprise determining position data of the pixel (the pixel to be compensated) on the display panel, and then calculating the aging degree data of the pixel (the pixel to be compensated) according to the attenuation model based on the determined electric current data, temperature data, and position data on the display panel. In this embodiment, the attenuation model may be expressed as:

$$F' = a * T_{gain} * L_{gain} * P_{gain} \tag{6}$$

where, $P_{gain}$ can be a function of the influence of the position of the pixel to be compensated on the display panel on the aging degree of the pixel to be compensated, i.e., a position attenuation function $P_{gain}$.

Pixels at different positions on the display panel have different aging rates due to interference from passive elements on the driving circuit board and the influence of voltage drop caused by energy loss in resistors. Due to the influence of the above factors, under the condition of displaying the same display gray-scale data, the pixels located near the driving circuit on the display panel will have a larger electric current value than the pixels far away from the driving circuit.

Figure 3:
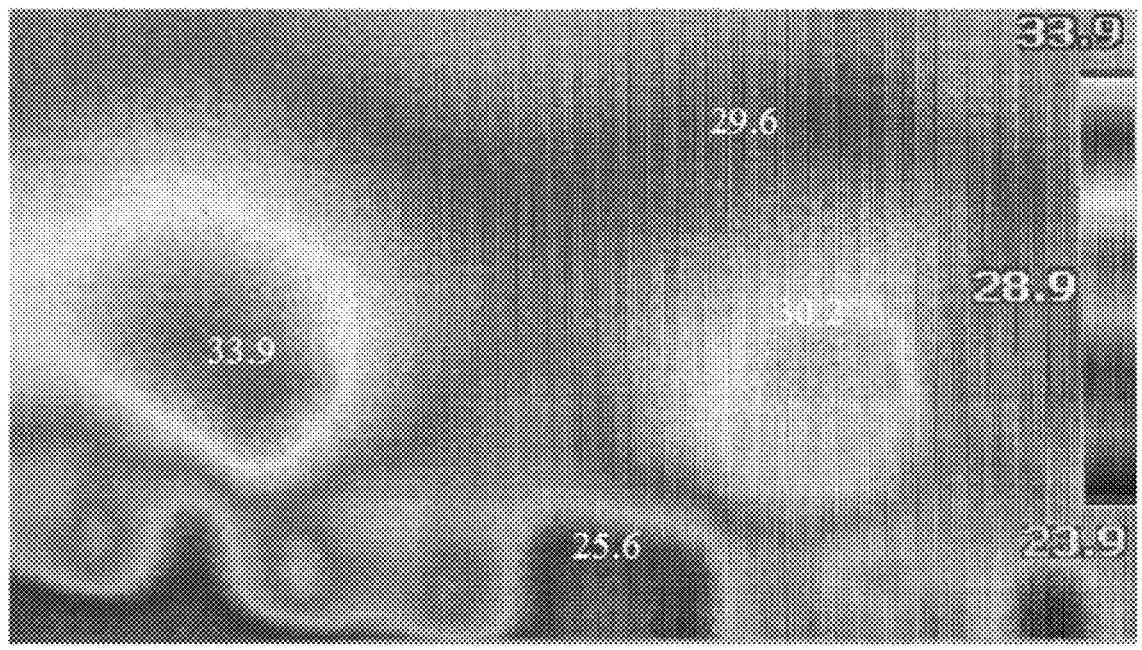
FIG. 3 shows a schematic diagram of a temperature distribution on a display panel.

In addition, for display panels with a large area, due to the influence of local heat sources and natural convection in the display panel, pixels at different positions in the display panel also have different temperature. FIG. 3 shows a schematic diagram of a temperature distribution on a display panel, and temperature data at different positions in the display panel is schematically indicated in FIG. 3.

Therefore, due to the influence of the above changes in temperature and electric current at different positions, aging degrees of the pixels at different positions of the display panel may be different under the condition that other factors influencing pixel aging remain the same. In the method for determining the aging degrees of the pixels in the display panel according to an embodiment of the present disclosure, the influence of position data of a pixel to be compensated on the aging degree of the pixel may be introduced, for example, by constructing an attenuation model F' including a position attenuation function $P_{gain}$, and calculating the aging degree data of the pixel to be compensated according to the position data of the position where the pixel to be compensated is located.

Figure 4:
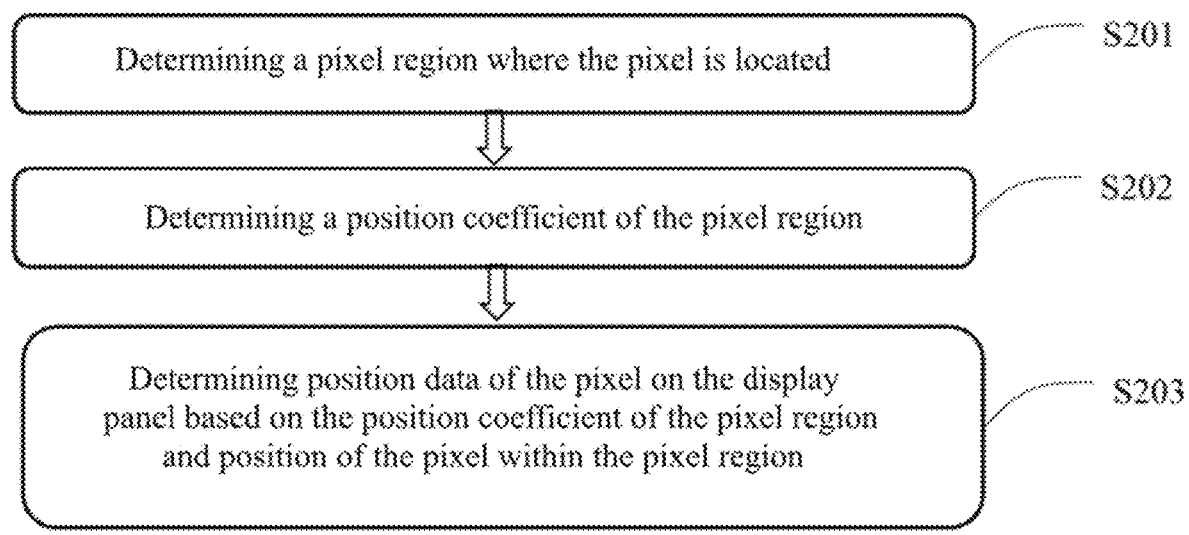
FIG. 4 shows a flowchart of determining position data according to an embodiment of the present disclosure.
Figure 5:
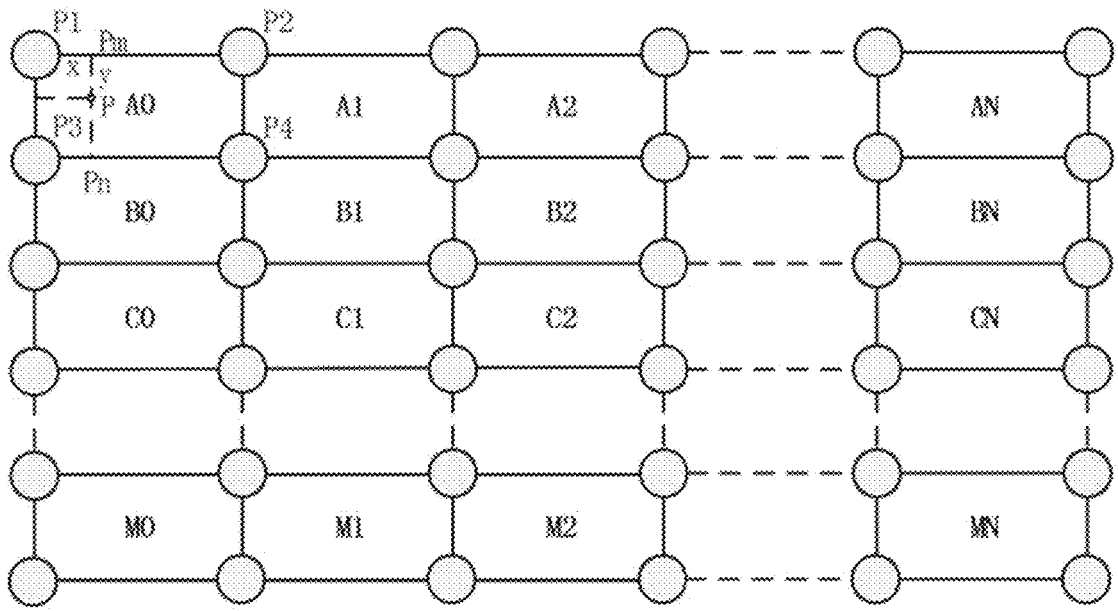
FIG. 5 shows a schematic diagram of determining position data according to an embodiment of the present disclosure.

FIG. 4 shows a flowchart of determining position data according to an embodiment of the present disclosure, and FIG. 5 shows a schematic diagram of determining position data according to an embodiment of the present disclosure. Hereinafter, a process of determining the position data of a pixel to be compensated according to an embodiment of the present disclosure will be described with reference to FIGS. 5 and 6.

As shown in FIG. 4, first, in step S201, a pixel region where the pixel (the pixel to be compensated) is located is determined. According to an embodiment of the present disclosure, for example, the display panel may be divided into K pixel regions according to the size of the display panel, where K may be a positive integer greater than 1. For example, as shown in FIG. 5, a rectangular display panel may be divided into M*N pixel regions, and each pixel region may include several pixels. For example, in the case where the display panel has m1*n1 pixels, the number of pixels included in each pixel region may be $$\frac{m1*n1}{M*N}.$$

Next, in step S202, a position coefficient of the pixel region where the pixel is located is determined, and the position coefficient represents the influence of the position of the pixel region on aging degrees of pixels in the pixel region. For example, the position coefficient of each pixel region can be determined by a large amount of actually measured data. For example, a higher position coefficient can be assigned to the pixel regions on the display panel that are close to the driving circuit, and a higher position coefficient can be assigned to the pixel regions on the display panel that are with a higher measured temperature. According to an embodiment of the present disclosure, the position coefficient may be set using four corner points of each pixel region. For example, for the pixel region A0, four corner points P1, P2, P3, P4 may be assigned position coefficient $P_1$, $P_2$, $P_3$, $P_4$, to characterize the position coefficient of the pixel region A0.

Then, in step S203, the position data of the pixel on the display panel is determined based on the position coefficient of the pixel region where the pixel is located and the position of the pixel within the pixel region.

For example, for the pixel P shown in FIG. 5, x represents the vertical distance of the pixel P from the connection line between the corner points P1 and P3, and y represents the vertical distance of the pixel P from the connection line between the corner points P1 and P2. For example, after determining the position coefficients $P_1$, $P_2$, $P_3$, $P_4$ assigned to the four corner points P1, P2, P3, P4, the position data $P_{mn}$ of the pixel P located within the pixel region A0 can be determined using a linear interpolation function as shown below.

$$P_m = P_2 * x + P_1 * (1-X) \quad (7)$$

$$P_n = P_4 * x + P_3 * (1-X) \quad (8)$$

$$P_{mn} = P_n * y + P_m * (1-y) \quad (9)$$

According to an embodiment of the present disclosure, the calculated aging degree data of each pixel on the display panel can also be stored in a memory, such that current aging degree data of a pixel can be read from the memory and display gray-scale data of the pixel can be compensated when the display luminance of the pixel needs to be compensated.

In addition, according to an embodiment of the present disclosure, it is also possible to set a sampling period to periodically calculate aging degree data of pixels on the display panel and update the data in the memory with the latest calculated aging degree data. For example, a pixel to be compensated is Pd, and the sampling period is set to 5 seconds. After the pixel to be compensated on the display panel displays for 5 seconds, the aging degree data Pd1 of the pixel to be compensated Pd will be determined according to the method for determining the aging degrees of the pixels as described above, and the data will be stored in the memory. After displaying for 10 seconds, the above process of determining the aging degrees of the pixels will be performed again, and new aging degree data Pd2 of the pixel to be compensated Pd will be obtained. At this time, the aging degree data Pd1 in the memory can be updated with the aging degree data Pd2. For example, the updated aging degree data of the pixel to be compensated Pd may be expressed as Pd1+Pd2.

According to an embodiment of the present disclosure, when a relatively large number of pixels are included in the display panel, storing aging degree data for each pixel in the memory will result in a problem of large amount of stored data. At this time, the aging degree data of pixels on the display panel can be stored in a manner of averaging the adjacent pixels. For example, when the number of pixels contained in the display panel (i.e., resolution) is 2400*1600, 2400 rows*1600 columns of pixels can be divided into, for example, 600*800 cells, each cell including 4 rows*2 columns=8 pixels. For 8 pixels belonging to the same cell, their respective aging degree data is represented by the same data. For example, the weighted average of aging degree data of the 8 pixels may be used to represent the aging degree data of the 8 pixels. This makes it possible to reduce the amount of stored data to ⅛ of original amount. According to an embodiment of the present disclosure, other ways can be adopted to reduce the amount of stored data of the aging degree data.

In the method for determining the aging degrees of the pixels in the display panel according to the present disclosure, the aging degree data of the pixel can be calculated according to the attenuation model F' based on the determined electric current data, temperature data and position data. The aging degree data represents the actual aging degree of the pixel to be compensated during its lifespan.

According to an embodiment of the present disclosure, the display luminance of the pixel to be compensated can be compensated based on the calculated aging degree data.

Figure 6:
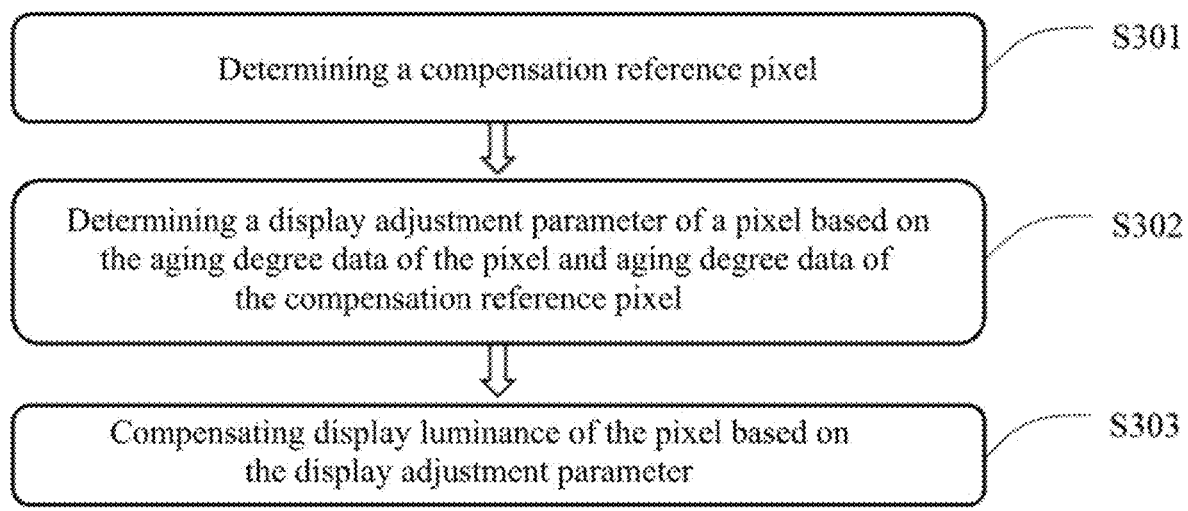
FIG. 6 shows a flowchart of a method for compensating display luminance of pixels according to an embodiment of the present disclosure.

FIG. 6 shows a flowchart of a method for compensating display luminance of pixels according to an embodiment of the present disclosure. Firstly, in step S301, a compensation reference pixel is determined, which can be used as a reference basis for pixel compensation of remaining pixels in the display panel, for example, the degree of the compensation for the remaining pixels can be determined based on aging degree data of the compensation reference pixel.

According to an embodiment of the present disclosure, the compensation reference pixel can be determined based on aging degree data of each pixel in the display panel. For example, the compensation reference pixel is determined by statistically sorting the aging degree data of each pixel in the display panel.

For example, for all pixel points in the display panel, a statistical sorting operation can be performed according to the numeral value of the aging degree data, and the compensation reference pixel can be selected according to specific actual requirements. For example, when requirements for the lifespan of the display panel is high and requirements for the display luminance of the display panel is low, the pixel with higher aging degree data can be selected as the compensation reference pixel. Optionally, when requirements for the display luminance of the display panel is high and requirements for the lifespan of the display panel is low, the pixel with lower aging degree data can be selected as the compensation reference pixel. In addition, the compensation reference pixel can also be selected according to actual requirements, and is not limited here.

Next, in step S302, for each pixel of remaining pixels except the compensation reference pixel, a display adjustment parameter of the pixel is determined based on the aging degree data of the pixel and the aging degree data of the compensation reference pixel.

For example, the determined aging degree data of the compensation reference pixel R is expressed as $F_0$, the aging degree data of the remaining pixels on the display panel is expressed as $F_{ij}$, in a case where the display panel has m1*n1 pixels, i=1, 2, 3 . . . m1, j=1, 2, 3 . . . n1, the display adjustment parameter may be expressed as $$D_{ij} = F_0/F_{ij} \qquad (10)$$

Next, in step S303, the display luminance of the pixel is compensated based on the display adjustment parameter. For example, display data of the pixel can be adjusted based on the display adjustment parameter, so that the display luminance of all pixels in the display panel is consistent when all pixels display the same gray-scale, thereby avoiding the image sticking phenomenon caused by different aging degrees of pixels in the display panel, wherein the display data can be display gray-scale data with a numerical value range of 0-255.

According to some embodiments of the present disclosure, a gray-scale compensation parameter $D_{ij}$ of the pixel to be compensated may be determined based on the gamma value gamma of the display panel and the display adjustment parameter $D_{ij}$ of the pixel to be compensated. Then, gray-scale compensation data can be determined based on the display gray-scale data of the pixel to be compensated and the gray-scale compensation parameter $D_{ij}'$. The gray-scale compensation parameter $D_{ij}'$ can be calculated as follows:

$$D_{ij}' = (D_{ij})^{\frac{1}{gamma}} \qquad (11)$$

For example, the display gray-scale data of the pixel can be expressed as $G_{ij}$, then the compensated gray-scale compensation data $G_{ij}'$ can be expressed as:

$$G_{ij}' = G_{ij} * D_{ij}'$$

According to an embodiment of the present disclosure, after the gray-scale compensation data $G_{ij}'$ of the pixel to be compensated is calculated, the gray-scale compensation data can be output, so that the display gray-scale data of the pixel to be compensated is adjusted based on the pixel to be compensated and the compensation reference pixel, and the display luminance of the pixel is compensated.

According to an embodiment of the present disclosure, the display luminance of the pixel on the display panel can be compensated in real time according to the method for determining the aging degrees of the pixels in the display panel and the method for compensating the pixels on the display panel as described above, so that even if the aging degrees of the pixels on the display panel are different, the light-emitting luminance of the pixels is consistent for the same gray-scale data.

Figure 7:
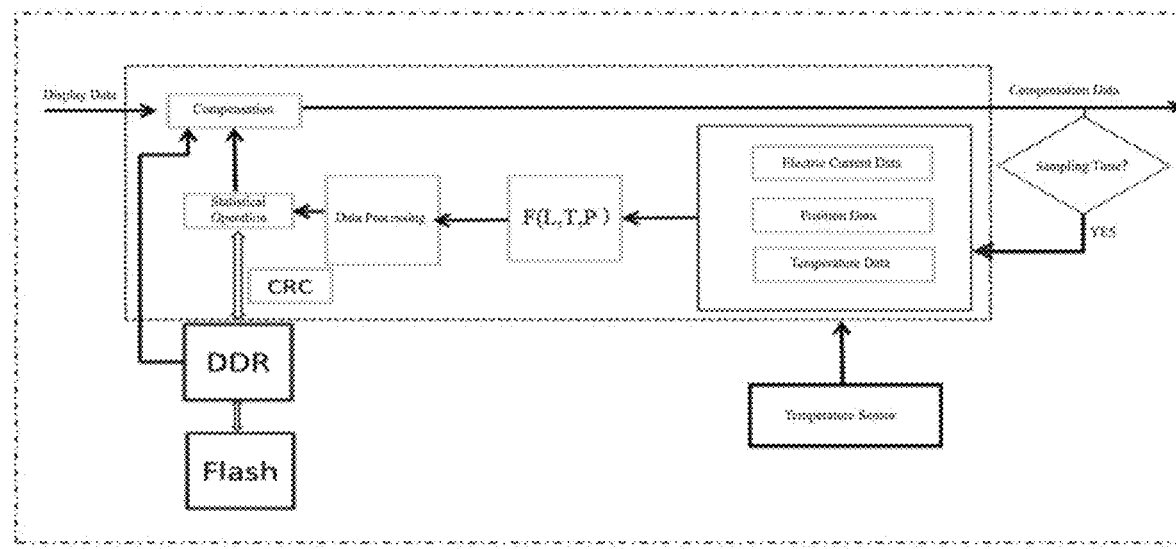
FIG. 7 shows a schematic diagram of compensating display luminance of pixels on the display panel according to an embodiment of the present disclosure.

FIG. 7 shows a schematic diagram of compensating display luminance of pixels on a display panel according to an embodiment of the present disclosure. A method for determining the aging degrees of the pixels in the display panel and a method for compensating the pixels on the display panel according to an embodiment of the present disclosure will be described below with reference to FIG. 7.

First, for a display panel including a plurality of pixels (e.g., m1*n1 pixels), aging degree data of each pixel can be calculated in real time in a display process, and display data of pixels in the display panel can be compensated based on the calculated aging degree data.

For example, for a certain pixel to be compensated $P_{ij}$ in the display panel, after its display gray-scale data $G_{ij}$ is received, its display gray-scale data can be compensated, so that the influence of pixel aging on light-emitting luminance can be eliminated. The compensation process may include reading the aging degree data of each pixel in the display panel from a memory (e.g., dynamic random access memory (DDR)), and may also statistically sort the aging degree data of each pixel for determining the number of pixels at different aging degrees, for example, may also determine the aging degree data of the pixel with the largest aging degree. Then, a compensation reference pixel is determined based on a result of the above statistical sorting and actual requirements. For example, when requirements for the lifespan of the display panel is high and requirements for the display luminance is low, the pixel with higher aging degree data can be selected as the compensation reference pixel $P_0$ and the aging degree data $F_0$ of the compensation reference pixel $P_0$ can be obtained.

Then, a display adjustment parameter $D_{ij}=F_0/F_{ij}$ of the pixel to be compensated is determined based on the aging degree data $F_{ij}$ of the pixel to be compensated $P_{ij}$ and the aging degree data $F_0$ of the compensation reference pixel $P_0$. A gray-scale compensation parameter $$D_{ij}' = (D_{ij})^{\frac{1}{gamma}}$$

of the pixel to be compensated is determined based on the gamma value gamma of the display panel and the display adjustment parameter $D_{ij}$ of the pixel to be compensated. Gray-scale compensation data $G_{ij}'=G_{ij}*D_{ij}'$ is determined based on the display gray-scale data $G_{ij}$ and the gray-scale compensation parameter $D_{ij}'$ of the pixel to be compensated. Then, the gray-scale compensation data $G_{ij}'$ for the pixel to be compensated $P_{ij}$ obtained after the compensation processing for pixel aging is output.

According to an embodiment of the present disclosure, aging degree data of pixels on the display panel can be updated in real time or periodically. For example, the aging degree data of pixels can be periodically calculated by setting a sampling period. The sampling period can be set such that calculation process is performed every 300 frames displayed, which is equivalent to that sampling is performed every 5 seconds in a case where a frame refresh rate is 60 Hz.

As shown in FIG. 7, after the display gray-scale data of the pixel to be compensated is compensated, it can be determined whether a sampling time has been reached. If it is determined that the sampling time has not been reached, for example, the number of frames having been displayed at present is 200 frames, the calculation process of the aging degree data is not performed. If it is determined that the sampling time has been reached, for example, the number of frames having been displayed at present is 300 frames, the calculation process of the aging degree data is performed.

Specifically, for a pixel to be compensated $P_{ij}$ at present, calculating the aging degree data of the pixel to be compensated may include the following steps. First, electric current data can be determined based on the compensation data $G_{ij}'$ obtained through the compensation processing. The process of determining the electric current data can refer to the above description of equations (4)-(5) and will not be repeated here. Then, position data of the pixel to be compensated can be determined, and the process of determining the position data can refer to the above description about equations (7)-(9), and will not be described here again. Next, ambient temperature $T_0$ can be obtained based on a temperature sensor provided on the display panel, and temperature data of the pixel to be compensated can be determined according to the above description about equations (2)-(3).

Next, based on the obtained electric current data, temperature data and position data on the display panel for the pixel to be compensated, the aging degree data $F_{ij}$ of the pixel to be compensated is determined according to an attenuation model. The attenuation model may be a function of the influence of the electric current, temperature, and position on the display panel on the degree of pixel aging that is obtained through a large amount of experimental data. Thus, it is possible to obtain the aging degree data of the pixel to be compensated after 300 frames of display screen are displayed (i.e., after 5 seconds of displaying).

The aging degree data of pixels in the display panel can also be processed in a way of averaging adjacent pixels for reducing the amount of stored data.

Then, the aging degree data $F_{ij_{old}}$ of the pixel to be compensated in the memory can be updated using the calculated aging degree data $F_{ij}$ of the pixel to be compensated, for example, the updated aging degree data of the pixel to be compensated can be expressed as $F_{ij_{new}} = F_{ij_{old}} + F_{ij}$.

In addition, in the process of pixel compensation for pixels, the aging degree data stored in the memory needs to be continuously read, and the aging degree data of pixels need to be stored in the memory after being calculated. For example, when a read operation or a write operation is performed on a DDR, data transmission errors may occur. According to an embodiment of the present disclosure, when the read operation and the write operation is performed on the DDR once, for example, a Cyclic Redundancy Check (CRC) algorithm can be used to check the data in the memory to avoid data errors.

According to an embodiment of the present disclosure, in order to avoid the loss of data stored in DDR, the data stored in DDR may also be stored in a Flash EEPROM Memory (Flash). Considering a case of abnormal power failure, the data in the Flash can be updated with the data in DDR every 30 minutes or 1 hour. The above-mentioned update interval can be set according to actual situations and is not limited here. In addition, CRC algorithm can also be used to check the data in the Flash to prevent data transmission errors.

Figure 8:
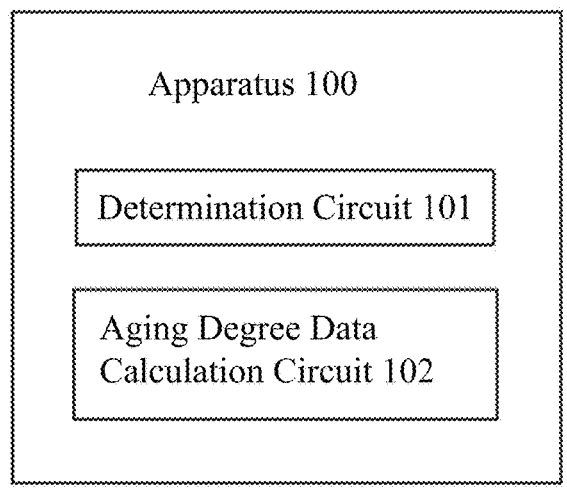
FIG. 8 shows a schematic diagram of an apparatus for determining aging degrees of pixels in the display panel according to an embodiment of the present disclosure.

According to an embodiment of the present disclosure, there is also provided an apparatus for determining aging degrees of pixels in a display panel, wherein the display panel includes a plurality of pixels. FIG. 8 shows a schematic diagram of an apparatus 100 for determining aging degrees of pixels in a display panel according to an embodiment of the present disclosure.

As shown in FIG. 8, the apparatus 100 for determining the aging degrees of the pixels in the display panel includes a determination circuit 101 and an aging degree data calculation circuit 102. The determination circuit 101 is configured to: for each pixel of the plurality of pixels, determine electric current data and temperature data of the pixel. The aging degree data calculation circuit 102 is configured to calculate aging degree data of the pixel according to an attenuation model based on the determined electric current data and temperature data.

According to an embodiment of the present disclosure, the determination circuit 101 determines the electric current data of the pixel based on display data of the pixel. The determination circuit 101 is further configured to determine position data of the pixel on the display panel. The aging degree data calculation circuit 102 is further configured to calculate the aging degree data of the pixel according to the attenuation model based on the determined electric current data, temperature data, and position data on the display panel.

According to an embodiment of the present disclosure, wherein the determining circuit 101 determining the position data of the pixel on the display panel comprises: determining a pixel region where the pixel is located, wherein the display panel is divided into a plurality of pixel regions; determining a position coefficient of the pixel region where the pixel is located; determining the position data of the pixel on the display panel based on the position coefficient and the position of the pixel within the pixel region. The process of determining the aging degrees of the pixels in the display panel by the above apparatus 100 is similar to the process of the method for determining the aging degrees of the pixels in the display panel as described above, and will not be repeated here.

Figure 9:
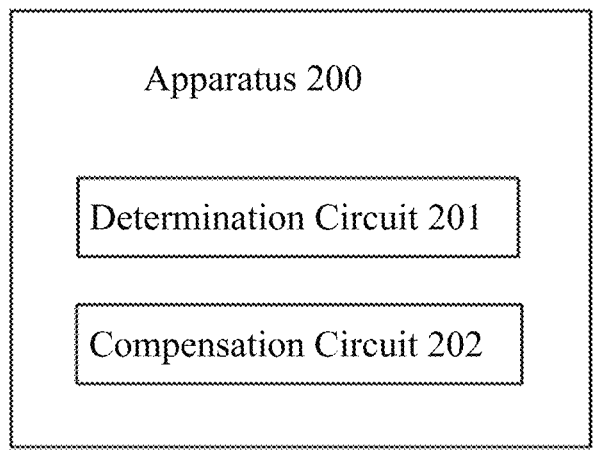
FIG. 9 shows a schematic diagram of an apparatus for compensating display luminance of pixels according to an embodiment of the present disclosure.

According to another aspect of the present disclosure, there is also provided an apparatus for compensating display luminance of pixels, and FIG. 9 shows a schematic diagram of an apparatus 200 for compensating the display luminance of pixels according to an embodiment of the present disclosure.

As shown in FIG. 9, the apparatus 200 includes a determination circuit 201 and a compensation circuit 202. The determination circuit 201 may be configured to determine a compensation reference pixel, and for each pixel of remaining pixels except the compensation reference pixel, determine a display adjustment parameter of the pixel based on the pixel and the compensation reference pixel. The compensation circuit 202 may be configured to compensate display luminance of the pixel based on the display adjustment parameter.

Among them, the determination circuit 201 may determine the compensation reference pixel based on aging degree data of each pixel, and determine the display adjustment parameter of the pixel based on the aging degree data of the pixel and the aging degree data of the compensation reference pixel.

According to an embodiment of the present disclosure, the determination circuit 201 determines the compensation reference pixel by statistically sorting aging degree data of each pixel in the display panel. In addition, the determination circuit 201 is further configured to determine a gray-scale compensation parameter of the pixel based on the gamma value of the display panel and the display adjustment parameter of the pixel, and the compensation circuit is further configured to determine gray-scale compensation data based on gray-scale data of the pixel and the gray-scale compensation parameter, and output the gray-scale compensation data of the pixel.

The process of the apparatus 200 according to an embodiment of the present disclosure for compensating pixels on the display panel is similar to the process of the method for compensating the display luminance of pixels, and will not be described again here.

Figure 10:
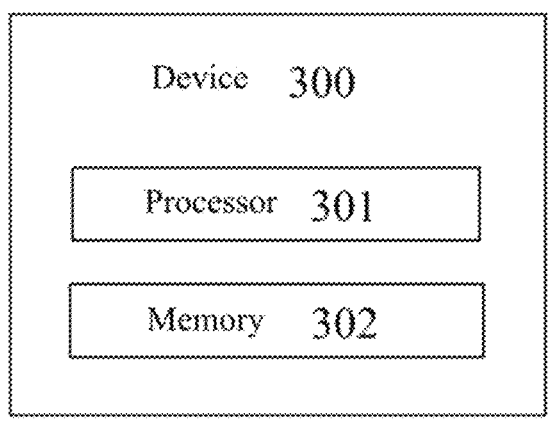
FIG. 10 shows a schematic diagram of a device for determining aging degrees of pixels in a display panel according to an embodiment of the present disclosure.

According to another aspect of the present disclosure, there is also provided a device for determining aging degrees of pixels in a display panel. FIG. 10 shows a schematic diagram of a device 300 for determining aging degrees of pixels in a display panel according to an embodiment of the present disclosure. The device 300 includes a processor 301 and a memory 302. The memory 302 includes a set of processor-executable instructions that, when executed by the processor, cause the processor 301 to perform the method for determining the aging degrees of the pixels in the display panel as described above.

Figure 11:
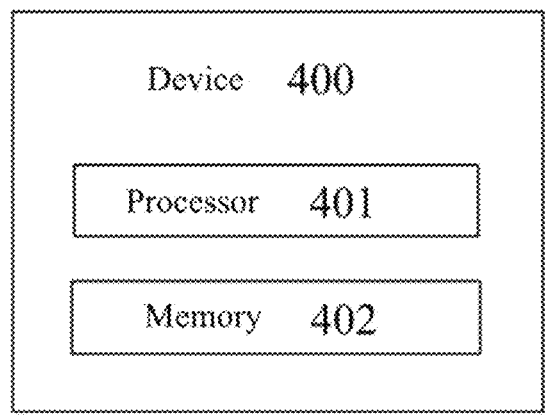
FIG. 11 shows a schematic diagram of a device for compensating display luminance of pixels according to an embodiment of the present disclosure.

According to yet another aspect of the present disclosure, a device for compensating display luminance of pixels is also provided. FIG. 11 shows a schematic diagram of a device 400 for compensating display luminance of pixels according to an embodiment of the present disclosure. The device 400 may include a processor 401 and a memory 402.

The memory 402 contains a set of processor-executable instructions that, when executed by the processor, causes the processor 401 to perform the method for compensating the display luminance of pixels as described above.

According to the embodiment of the present disclosure, the processor 301 and the processor 401 may be separate processing devices or may be implemented as a same processing device.

The present disclosure provides a method, an apparatus and a device for determining aging degrees of pixels in a display panel and a method, an apparatus and a device for compensating display luminance of pixels. According to the method, the apparatus and the device for determining the aging degrees of the pixels in the display panel disclosed by the present disclosure, a pixel attenuation model can be constructed based on a large amount of data which has influence on the aging degree, such as temperature data, electric current data, position of a pixel in the display panel and the like; and then for each pixel in the display panel, aging degree data of the pixel which changes over time can be calculated using the determined electric current data and temperature data along with position data on the display panel according to the constructed attenuation model; in addition, the aging degree data of each pixel can be updated regularly by setting a sampling time interval, and the aging degree data is stored in a memory for compensating display data of pixels in real time. According to the method, the apparatus and the device for compensating pixels disclosed by the disclosure, firstly, a compensation reference pixel is determined based on aging degree data of each pixel in the display panel, and display data of the pixel to be compensated at present is compensated based on the aging degree data of the compensation reference pixel and the aging degree data of the pixel to be compensated at present, so that the light-emitting luminance of pixels which are needed to display the same gray-scale is consistent, the problem of image sticking in display is avoided, the service lifespan of the display panel is prolonged, and the user experience is improved.

One of ordinary skill in the art can understand that all or part of the steps in the above method can be completed by instructing relevant hardware through a program, which can be stored in a computer readable storage medium, such as a read-only memory, a magnetic disk or an optical disk, etc. Optionally, all or part of the steps of the above embodiments may also be implemented using one or more integrated circuits. Accordingly, each module/circuit in the above embodiments can be implemented in the form of hardware or software functional modules. The present disclosure is not limited to any specific form of combination of hardware and software.

Unless otherwise defined, all terms (including technical and scientific terms) used herein have the same meaning as commonly understood by one of ordinary skill in the art to which this disclosure belongs. It should also be understood that terms such as those defined in a general dictionary should be interpreted to have a meaning consistent with their meaning in the context of the related art, and should not be interpreted in an idealized or extremely formalized meaning unless explicitly so defined herein.

The above is an explanation of the present disclosure and should not be considered as a limitation thereof. Although several exemplary embodiments of the present disclosure have been described, those skilled in the art will readily appreciate that many modifications can be made to the exemplary embodiments without departing from the novel teachings and advantages of the present disclosure. Therefore, all such modifications are intended to be included within the scope of this disclosure as defined by the claims. It should be understood that the above is an explanation of the present disclosure and should not be considered as limited to the specific embodiments disclosed, and modifications to the disclosed embodiments and other embodiments are intended to be included within the scope of the appended claims. The present disclosure is defined by the claims and their equivalents.

This application claims priority to Chinese patent application No. 201811577831.X filed on Dec. 20, 2018, the entire text of which is hereby incorporated by reference as a part of this application.

What is claimed is:

1. A method for determining aging degrees of pixels in a display panel, comprising: for each pixel of at least a portion of pixels in the display panel including a plurality of pixels,
    determining electric current data, temperature data, and position data on the display panel of the pixel; and
    calculating aging degree data of the pixel according to an attenuation model, based on the determined electric current data, temperature data, and position data on the display panel,
    wherein the determining the position data on the display panel of the pixel comprises:
        determining a pixel region where the pixel is located on the display panel, wherein the display panel is divided into a plurality of pixel regions;
        determining a position coefficient of the pixel region where the pixel is located; and
        determining the position data on the display panel of the pixel based on the position coefficient and a position of the pixel within the pixel region.

2. The method according to claim 1, wherein the determining the electric current data of the pixel comprises:
    determining the electric current data of the pixel based on display data of the pixel.

3. A device for determining aging degrees of pixels in a display panel, comprising:
    a processor, and
    a memory comprising a set of processor executable instructions that, when executed by the processor, cause the processor to perform the method according to claim 1.

4. A method of compensating display luminance of pixels, comprising:
    determining a compensation reference pixel on a display panel;
    for each pixel of remaining pixels except the compensation reference pixel, determining a display adjustment parameter of the pixel based on aging degree data of the pixel and aging degree data of the compensation reference pixel; and
    compensating display luminance of the pixel based on the display adjustment parameter,
    wherein the determining the compensation reference pixel comprises determining the compensation reference pixel based on aging degree data of each pixel on the display panel, wherein the again degree data of each pixel is determined by:
  determining electric current data, temperature data, and position data on the display panel of the pixel; and
  calculating the aging degree data of the pixel according to an attenuation model, based on the determined electric current data, temperature data, and position data on the display panel,
wherein the determining the position data on the display panel of the pixel comprises:
  determining a pixel region where the pixel is located on the display panel, wherein the display panel is divided into a plurality of pixel regions;
  determining a position coefficient of the pixel region where the pixel is located; and
  determining the position data on the display panel of the pixel based on the position coefficient and a position of the pixel within the pixel region.

5. The method according to claim 4, further comprising: determining the compensation reference pixel by statistically sorting the aging degree data of each pixel in the display panel.

6. The method according to claim 4, further comprising: determining a gray-scale compensation parameter of the pixel based on a gamma value of the display panel and the display adjustment parameter of the pixel.

7. The method according to claim 6, further comprising: determining gray-scale compensation data based on gray-scale data of the pixel and the gray-scale compensation parameter.

8. The method according to claim 7, further comprising: outputting the gray-scale compensation data of the pixel.

9. A device for compensating display luminance of pixels, comprising:
  a processor, and
  a memory comprising a set of processor executable instructions that, when executed by the processor, cause the processor to perform the method according to claim 4.

10. An apparatus for determining aging degrees of pixels in a display panel, the display panel comprising a plurality of pixels, the apparatus comprising:
  a determination circuit configured to, for each pixel of at least a portion of pixels of the plurality of pixels, determine electric current data, temperature data, and position data on the display panel of the pixel; and
  an aging degree data calculation circuit configured to calculate aging degree data of the pixel according to an attenuation model, based on the determined electric current data, temperature data, and position data on the display panel,
  wherein in order to determine the position data on the display panel of each pixel, the determination circuit is configured to:
    determine a pixel region where the pixel is located on the display panel, wherein the display panel is divided into a plurality of pixel regions;
    determine a position coefficient of the pixel region where the pixel is located; and
    determine the position data on the display panel of the pixel based on the position coefficient and a position of the pixel within the pixel region.

11. The apparatus according to claim 10, wherein, the determination circuit determines the electric current data of the pixel based on display data of the pixel.

12. An apparatus for compensating display luminance of pixels, comprising:
  a determination circuit configured to determine a compensation reference pixel on a display panel, and for each pixel of remaining pixels except the compensation reference pixel, determine a display adjustment parameter of the pixel based on aging degree data of the pixel and aging degree data of the compensation reference pixel; and
  a compensation circuit configured to compensate display luminance of the pixel based on the display adjustment parameter,
  wherein the determination circuit is further configured to determine the compensation reference pixel based on aging degree data of each pixel on the display panel,
  wherein the aging degree data of each pixel is determined by:
    determining electric current data, temperature data, and position data on the display panel of the pixel; and
    calculating the aging degree data of the pixel according to an attenuation model, based on the determined electric current data, temperature data, and position data on the display panel,
  wherein the determining the position data on the display panel of the pixel comprises:
    determining a pixel region where the pixel is located on the display panel, wherein the display panel is divided into a plurality of pixel regions;
    determining a position coefficient of the pixel region where the pixel is located; and
    determining the position data on the display panel of the pixel based on the position coefficient and a position of the pixel within the pixel region.

13. The apparatus according to claim 12, wherein the determination circuit determines the compensation reference pixel by statistically sorting the aging degree data of each pixel on the display panel.

14. The apparatus according to claim 12, wherein the determination circuit is further configured to determine a gray-scale compensation parameter of the pixel based on a gamma value of the display panel and the display adjustment parameter of the pixel, and
  the compensation circuit is further configured to determine gray-scale compensation data based on gray-scale data of the pixel and the gray-scale compensation parameter, and output the gray-scale compensation data of the pixel.

* * * * *

UNITED STATES PATENT AND TRADEMARK OFFICE
CERTIFICATE OF CORRECTION

| | | |
|---|---|---|
| PATENT NO. | : 11,682,346 B2 | Page 1 of 1 |
| APPLICATION NO. | : 16/960433 | |
| DATED | : June 20, 2023 | |
| INVENTOR(S) | : Chengte Lai et al. | |

It is certified that error appears in the above-identified patent and that said Letters Patent is hereby corrected as shown below:

On the Title Page

Column 1; Item (30); Foreign Application Priority Data:
Please Delete "Dec. 20, 2018 (CN) ................. 20181157783.X"
And insert -- Dec. 20, 2018 (CN) ................. 201811577831.X --

Signed and Sealed this
First Day of October, 2024

*Katherine Kelly Vidal*

Katherine Kelly Vidal
*Director of the United States Patent and Trademark Office*